(12) United States Patent
Domoto et al.

(10) Patent No.: US 6,572,936 B1
(45) Date of Patent: Jun. 3, 2003

(54) HARD CARBON FILM-COATED SUBSTRATE AND METHOD FOR FABRICATING THE SAME

(75) Inventors: Yoichi Domoto, Ikoma (JP); Hitoshi Hirano, Nishinomiya (JP); Keiichi Kuramoto, Kadoma (JP); Seiichi Kiyama, Takatsuki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/433,077

(22) Filed: Nov. 3, 1999

Related U.S. Application Data

(62) Division of application No. 08/923,638, filed on Sep. 4, 1997, now Pat. No. 6,022,622.

(30) Foreign Application Priority Data

Jun. 9, 1996  (JP) .............................. 8-236728
Jun. 9, 1996  (JP) .............................. 8-236729
Nov. 8, 1997  (JP) .............................. 9-216319

(51) Int. Cl.$^7$ .............................................. C23C 14/06
(52) U.S. Cl. ...................................... 427/577; 423/446
(58) Field of Search ................................ 427/577, 249; 423/446

(56) References Cited

U.S. PATENT DOCUMENTS

| | | | |
|---|---|---|---|
| 3,892,890 A | | 7/1975 | Watanabe |
| 4,774,130 A | | 9/1988 | Endo et al. |
| 4,783,368 A | | 11/1988 | Yamamoto et al. |
| 4,842,937 A | | 6/1989 | Meyer et al. |
| 4,915,977 A | * | 4/1990 | Okamoto et al. ............ 423/446 |
| 4,933,058 A | | 6/1990 | Bache |
| 5,032,243 A | * | 7/1991 | Bache et al. |
| 5,112,025 A | | 5/1992 | Nakayama |
| 5,135,808 A | | 8/1992 | Kimock et al. |
| 5,232,568 A | * | 8/1993 | Parent et al. |
| 5,249,554 A | | 10/1993 | Tamor et al. |
| 5,295,305 A | * | 3/1994 | Hahn et al. |
| 5,380,349 A | | 1/1995 | Taniguchi et al. |
| 5,391,407 A | | 2/1995 | Dearnaley |
| 5,427,827 A | * | 6/1995 | Shing et al. ................. 427/249 |
| 5,473,818 A | * | 12/1995 | Otsuka et al. |
| 5,538,799 A | | 7/1996 | Nanya |
| 5,616,374 A | * | 4/1997 | Sho ............................ 427/249 |
| 5,669,144 A | | 9/1997 | Hahn et al. |
| 5,691,010 A | * | 11/1997 | Kuramoto et al. ............ 427/577 |
| 5,695,832 A | * | 12/1997 | Hirano et al. ................. 427/577 |
| 5,750,956 A | * | 5/1998 | Barnes et al. |

FOREIGN PATENT DOCUMENTS

| | | | |
|---|---|---|---|
| EP | 0 259 791 | | 3/1988 |
| EP | 327110 | * | 8/1989 |
| EP | 0 363 648 | | 4/1990 |
| EP | 0 474 369 | | 3/1992 |
| EP | 474369 | * | 3/1992 |
| EP | 0-605179 | | 12/1993 |
| JP | 58-126972 | | 7/1983 |
| JP | 59-173270 | | 10/1984 |
| JP | 61-117281 | | 6/1986 |
| JP | 61-258713 | | 11/1986 |
| JP | 61-267929 | | 11/1986 |
| JP | 62-119 | | 1/1987 |
| JP | 62-196371 | | 8/1987 |
| JP | 63-65074 | | 3/1988 |
| JP | 2-97677 | | 4/1990 |
| JP | 2-120245 | | 5/1990 |
| JP | 3-501458 | | 4/1991 |
| JP | 3-229882 | | 10/1991 |
| JP | 4-10377 | | 1/1992 |
| JP | 4-154633 | | 5/1992 |
| JP | 4-154634 | | 5/1992 |
| JP | 4-232249 | | 8/1992 |
| JP | 4-341582 | | 11/1992 |
| JP | 5-168774 | | 7/1993 |
| JP | 05168774 | * | 7/1993 |
| JP | 5-320910 | | 7/1993 |
| JP | 5-214532 | | 8/1993 |
| JP | 5-69194 | | 9/1993 |
| JP | 5-295545 | | 9/1993 |
| JP | 5-263251 | | 12/1993 |
| JP | 6-248422 | | 6/1994 |
| JP | 6-248442 | | 6/1994 |
| JP | 6-220637 | | 8/1994 |
| JP | 6-240451 | | 8/1994 |
| JP | 6-264264 | | 9/1994 |
| JP | 07-070756 | | 3/1995 |
| JP | 7-330490 | | 12/1995 |
| WO | 87/04471 | | 7/1987 |

OTHER PUBLICATIONS

Abstract of JP 58126972 published Jul. 28, 1983.*
Patent Abstracts of Japan, vol. 018, No. 632 (C–1280), Dec. 2, 1994 & JP 06–240451 A (Seko Instr. Inc.), Aug. 30, 1994.
Patent Abstracts of Japan, vol. 014, No. 330 (C–0741), Jul. 16, 1990 & JP 02–120245A (Olympus Optical Co., Ltd.), May 8, 1990.
English translation of EP 0385283 A2. No Date.
Japanese Notice of Groundsof Rejection, Oct. 22, 2002.
European Search Report, Sep. 26, 2002.

* cited by examiner

Primary Examiner—Archene Turner
(74) Attorney, Agent, or Firm—Rader, Fishman & Grauer PLLC

(57) ABSTRACT

A hard carbon film-coated substrate is disclosed which has between a substrate and a hard carbon film an interlayer principally comprised of at least one selected from the group consisting of Al, Cr, Sn, Co and B, oxides, nitrides and carbides thereof.

9 Claims, 14 Drawing Sheets

(a)

(b)

(c)

HARD CARBON FILM-COATED SUBSTRATE AND METHOD FOR FABRICATING THE SAME

This is a divisional application of U.S. patent application Ser. No. 08/923,638, filed on Sep. 4, 1997, the disclosure of which is hereby incorporated by reference now U.S. Pat. No. 6,022,622.

BACKGROUND OF THE INVENTION

1. Field of the Invention

The present invention relates to a hard carbon film-coated substrate which has a hard carbon film formed on a substrate surface and to a method for fabricating the hard carbon film-coated substrate. The present invention further relates to a method for providing a hard carbon film on a substrate, more particularly to a method for providing a protective film such as on inner and outer blades of an electric shaver, magneto-optical disks, thin film magnetic heads and surface acoustic wave (SAW) devices; an antireflection film for lithography; a protective film on sliding surfaces of compressors; or a hard carbon film such as on constituent layers of solar batteries, decorative articles and optical parts.

2. Description of Related Art

It has been conventionally known that the formation of a diamond-like carbon film directly on a substrate results in poor adhesion between the diamond-like carbon film and the substrate. In order to overcome such a disadvantage, proposals have been made which interpose a Si interlayer between the diamond-like carbon film and the substrate (see, for example, Japanese Patent Laying-Open Nos. 2-182880 (1990), 3-115572(1991) and 1-138611(1989)).

Japanese Patent Laying-Open Nos. 7-41386(1995) and 7-316818(1995) disclose that the adhesion between a hard carbon film and a substrate can be improved by providing an interlayer of Si, Ru or Ge therebetween even when the substrate is made of a metal or an alloy principally formed of Ni or Al, suitably used such as for an electric shaver blade, or of a stainless steel.

The above-described prior art interlayer is effective in improving adhesion and peel resistance between the substrate and the hard carbon film, e.g. the diamond-like carbon film if interposed therebetween. However, considering the technological abundance in the field and applicability to various technological situations, there still remains a need for the other type of interlayer which is also capable of improving the adhesion and peel resistance between the substrate and the hard carbon film.

The above-described conventional interlayers have been formed by vapor phase epitaxial methods such as a sputtering method and a plasma CVD method. This requires that the thickness of the interlayer be made greater, or alternatively, the substrate position be changed during the interlayer formation if the substrate has a complicated three-dimensional configuration.

SUMMARY OF THE INVENTION

It is an object of the present invention to provide a hard carbon film-coated substrate which exhibits improved adhesion and peel resistance between a hard carbon film and a substrate, and a method for providing the hard carbon film-coated substrate.

It is another object of the present invention to provide a method for providing a hard carbon film on a substrate whereby an interlayer can be uniformly formed even on a substrate having complicated three-dimensional configurations and a satisfactory adhesion can be imparted between the hard carbon film and the substrate.

The hard carbon film-coated substrate in accordance with a first aspect of the present invention includes a substrate, a hard carbon film and an interlayer formed between the substrate and the hard carbon film. The interlayer is principally comprised of at least one selected from the group consisting of Al, Cr, Sn, Co and B, oxides, nitrides and carbides thereof.

Any method such as sputtering can be employed to form the interlayer in accordance with the first aspect of the present invention. In the event that the sputtering method is employed, it is preferred to form the interlayer while applying a radio frequency voltage to a substrate so that a self-bias voltage is produced across the substrate. Preferably, the self-bias voltage produced in the substrate is controlled not to exceed −20 V to assure the enhanced adhesion of the hard carbon film to the substrate.

The interlayer in accordance with the first aspect of the present invention may be formed using other physical deposition or chemical vapor phase epitaxial methods. Plating may be employed to form a metallic interlayer, for example.

The term "hard carbon film" as used in the first aspect of the present invention is intended to include an amorphous diamond-like carbon film, a diamond-like carbon film having amorphous and crystalline portions, and a crystalline diamond-like carbon film.

A method of forming the hard carbon film in the first aspect of the present invention is not particularly limited. The hard carbon film can be formed such as by a CVD method, e.g. a plasma CVD method. Analogously to the interlayer formation, it is preferred to form the hard carbon film while applying a radio frequency voltage to a substrate so that a self-bias voltage is produced across the substrate. Preferably, the self-bias voltage produced in the substrate is controlled not to exceed −20 V. In the plasma CVD method, an electron cyclotron resonance (ECR) plasma CVD apparatus can be employed as a means for generating a plasma, for example. The use of such an apparatus increases a plasma density and enables a high-quality hard carbon film to be formed at low temperatures.

The hard carbon film-coated film in accordance with the first aspect of the present invention is applicable to inner and outer blades of an electric shaver, for example. Those inner and outer electric shaver blades are typically formed of a metal or an alloy principally comprised of Ni or Al, or of a stainless steel. Accordingly, a substrate formed of these materials can be employed as a substrate in the first aspect of the present invention.

The substrate is not limited to the inner and outer blades of an electric shaver, but is also applicable to magneto-optical disks, thin film magnetic heads and surface acoustic wave (SAW) devices. The hard carbon film may be provided thereon to serve as a protective film therefor. Also, the hard carbon film may be provided to serve as an antireflection film which can be used during exposure in a lithography method. Furthermore, the hard carbon film may be provided to serve as a protective film for sliding parts of a compressor such as a rotary compressor, as a solar cell protective film layer, as an optical part, or as a part of decorative articles.

The material types of the substrate in accordance with the first aspect of the present invention include cast irons such as Mo—Ni—Cr cast irons, steel such as high-speed tool steel, stainless steel such as SUS 304, ferrous alloys, non-ferrous metallic materials, ceramics, noble metals, and carbons. The non-ferrous metallic materials and ceramics include a single, alloy or sintered form of Ti, Al, Zr, Si, W, Mo, In, Ta, Fe, Ni, Co, Mn, Cr or Zn; and oxides, nitrides and carbides thereof. The noble metals include Au, Ag, Pt, Ru and Pd. The carbons include aluminum-impregnated carbons.

A method for providing a hard carbon film on a substrate, in accordance with the second aspect of the present invention, includes the steps of forming an interlayer on the substrate by plating and forming the hard carbon film on the interlayer.

In accordance with a narrower, second aspect of the present invention, a method includes the steps of deposition-forming a substrate on a mold through electroforming, forming an interlayer on the substrate by plating, and forming a hard carbon film on the interlayer.

In the step of forming the interlayer by plating, the interlayer can be formed while the substrate is held on the mold. This eliminates the necessity of disengaging the substrate from the mold to thereby increase the productivity of the resulting hard carbon film-coated articles.

The hard carbon film in accordance with the second aspect of the present invention includes an amorphous diamond-like carbon film and a diamond-like carbon film containing crystallites. It further includes a crystalline diamond-like carbon film.

In the second aspect of the present invention, a method of forming the hard carbon film is not particularly limited. The hard carbon film can be formed such as by a CVD method. A plasma CVD method can be employed, for example, to form the hard carbon film while applying a radio frequency voltage to a substrate so that a self-bias voltage is produced across the substrate. In such an event, it is preferred that the self-bias voltage produced in the substrate is controlled not to exceed −20 V. In the plasma CVD method, an electron cyclotron resonance (ECR) plasma CVD apparatus can be employed as a means for generating a plasma, for example. The use of such an apparatus increases a plasma density and enables a high-quality hard carbon film to be formed at low temperatures.

In the step of forming the interlayer by plating, generally-employed plating techniques may be adopted which include electroplating and electroless plating. When the electroplating is employed to form the interlayer, it is generally required that at least a surface of the substrate be electrically conductive.

In accordance with the second aspect of the present invention, the interlayer is formed by plating. This enables the interlayer to be formed to a uniform thickness even on the substrate having complicated three-dimensional configurations. Accordingly, the interlayer can be uniformly formed even on substrate edge portions which have been difficult to be covered through thin film formation by conventional vapor phase methods. As a consequence, the adhesion of the hard carbon film to the substrate is enhanced. Also, such a uniform formation of the interlayer permits an average thickness of the interlayer to be controlled smaller than that of the interlayer formed by conventional vapor phase methods.

The thickness of the interlayer in accordance with the second aspect of the invention is not particularly specified, but is preferably in the range of 50–5000 Å, more preferably in the range of 100–3000 Å.

In accordance with the second aspect of the present invention, the interlayer can be uniformly formed even on a substrate having the above-described complicated three-dimensional configurations. Accordingly, the present method is advantageously applicable to a substrate having complicated three-dimensional configurations, e.g. inner and outer blades of an electric shaver. The electric shaver blades are generally formed of a metal or an alloy principally comprised of Ni or Al, or stainless steel. Thus, the second aspect of the present invention is advantageously applicable to those substrates.

The substrate is not limited to the inner and outer blades of an electric shaver, but is also applicable to magneto-optical disks, thin film magnetic heads and surface acoustic wave (SAW) devices. The hard carbon film may be provided thereon to serve as a protective film therefor. Also, the hard carbon film may be provided to serve as an antireflection film which can be used during exposure in a lithography method. Furthermore, the hard carbon film may be provided to serve as a protective film for sliding parts of a compressor such as a rotary compressor, as a solar cell protective film layer, as an optical part, or as a part of decorative articles.

The material types of the substrate in accordance with the second aspect of the present invention include cast irons such as Mo—Ni—Cr cast irons, steel such as high-speed tool steel, stainless steel such as SUS 304, ferrous alloys, non-ferrous metallic materials, ceramics, noble metals, and carbons. The non-ferrous metallic materials and ceramics include a single, alloy or sintered form of Ti, Al, Zr, Si, W, Mo, In, Ta, Fe, Ni, Co, Mn, Cr or Zn; and oxides, nitrides and carbides thereof. The noble metals include Au, Ag, Pt, Ru and Pd. The carbons include aluminum-impregnated carbons.

Any interlayer material which can be formed by plating and enhance the adhesion between the substrate and the hard carbon film may be utilized. The specific examples of the interlayer materials include metals such as Ru, Cr, Sn and Co, and alloys principally comprised thereof.

Also, the interlayer in the second aspect of the present invention may be formed by composite plating which disperses fine particles such as of ceramics throughout a resulting metallic film. Such composite plating can be accomplished by conventionally known techniques. The metallic film containing fine particles in a dispersed form can be generally produced by plating in a plating bath containing dispersions of fine particles.

Examples of the fine particles dispersed in the composite metallic film include oxides, nitrides and carbides of Al, Ru, Ti, Cr, Sn, Co, Si, B or Zr. The content of fine particles dispersed in the metallic film is preferably in the range of 0.1–30 volume %, more preferably in the range of 1–10 volume %. The preferred particle size of the fine particles is not greater than 1 $\mu$m.

In the event that the composite metallic film is formed as the interlayer in accordance with the second aspect of the present invention, the fine particles dispersed in the metallic film are effective in enhancing the adhesion to the overlying hard carbon film. Accordingly, the material which constitutes a matrix in the metallic film can be selected from a wider range of materials than the above-described materials for the metallic film. For example, the adhesion of the hard carbon film to a Ni substrate can be improved by plating on the Ni substrate the material identical to that of the substrate, i.e. Ni, to form a Ni film in which the fine particles are dispersed.

DESCRIPTION OF THE PREFERRED EMBODIMENTS

Figure 1:
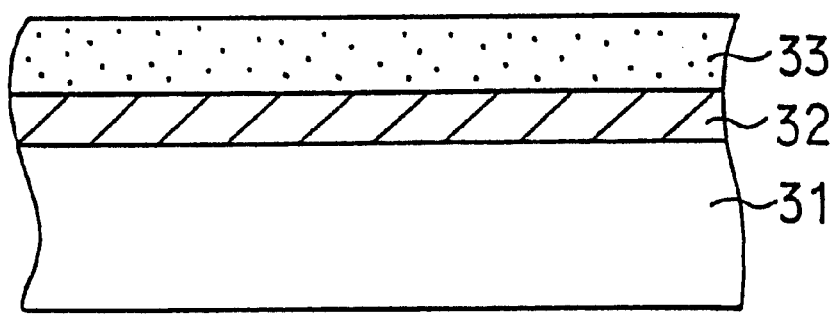
FIG. 1 is a cross-sectional view of one embodiment of a hard carbon film-coated substrate in accordance with a first aspect of the present invention.

FIG. 1 is a cross-sectional view of one embodiment of a hard carbon film-coated substrate in accordance with a first aspect of the present invention. Referring to FIG. 1, formed on a substrate 31 is an interlayer 32 on which a hard carbon film, i.e. a diamond-like carbon film 33 is formed. The thickness of the interlayer 32 is preferably in the range of 50–8000 Å, more preferably in the range of 50–4000 Å. The thickness of the diamond-like carbon film 33 is preferably in the range of 50–5000 Å, more preferably in the range of 50–3000 Å.

Figure 2:
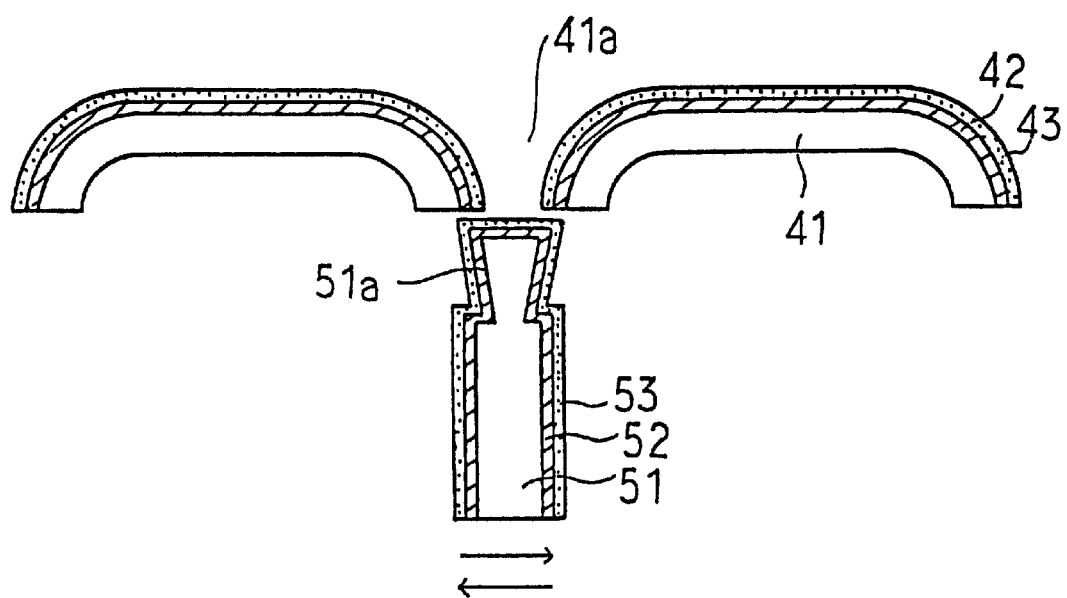
FIG. 2 is a cross-sectional view of an electric shaver embodiment in which the first aspect of the present invention is applied to inner and outer blades thereof.
Figure 3:
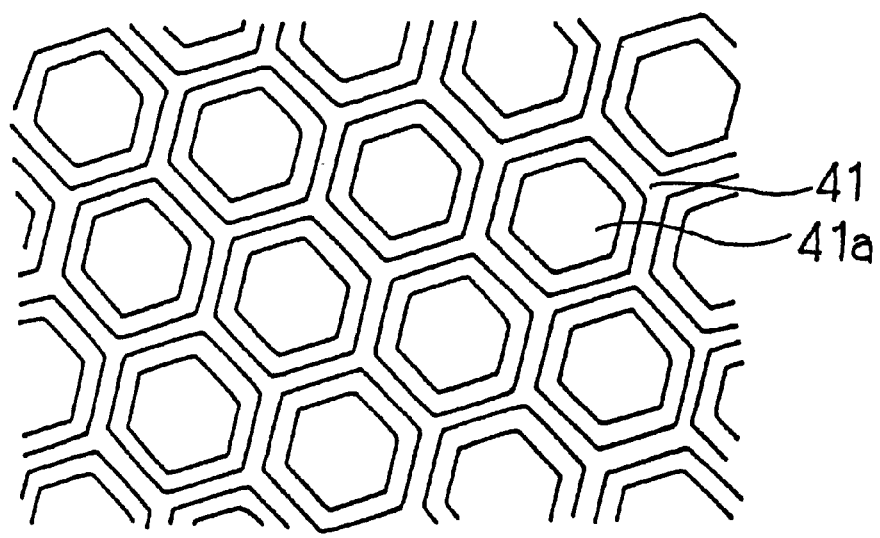
FIG. 3 is a plan view showing a planar pattern of an outer blade of the electric shaver.

FIG. 2 is a cross-sectional view of an electric shaver blade embodiment in which the present invention is applied to its inner and outer blades. Referring to FIG. 2, formed on an outer blade substrate 41 is an interlayer 42 on which a hard carbon film, i.e. a diamond-like carbon film 43 is formed. FIG. 3 is a plan view showing a planar pattern of the outer blade substrate 41. As illustrated in FIG. 3, the outer blade substrate 41 has a number of holes 41a for catching beards.

Figure 4:
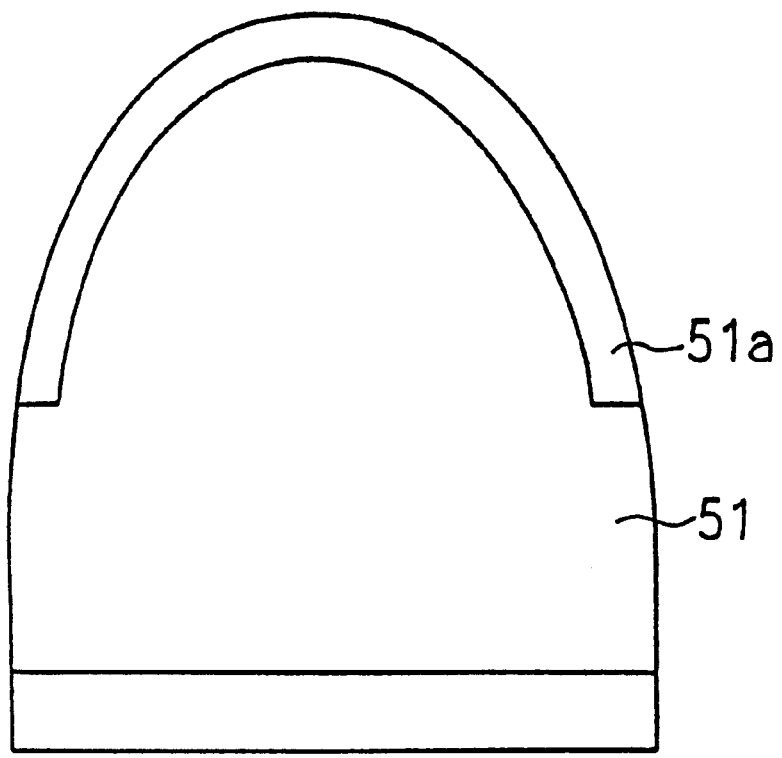
FIG. 4 is a front view showing an inner blade of the electric shaver.

Referring back to FIG. 2, an inner blade is arranged inwardly of the outer blade substrate 41. Formed on a substrate 51 of the inner blade is an interlayer 52 on which a hard carbon film, i.e. a diamond-like carbon film 53 is formed. FIG. 4 is a front view of the inner blade substrate 51. As illustrated in FIG. 4, the inner blade substrate 51 has at its upper end tapered surfaces 51a each of which shows a downward slope (also refer to FIG. 2) from an upper edge when cross-sectioned. Again referring back to FIG. 2, as the inner blade slides on the outer blade in directions as indicated by arrows, the beards caught in the holes 41a are cut.

In this particular embodiment, the outer blade substrate 41 is formed of Ni whereas the inner blade substrate 51 is formed of stainless steel (SUS).

Figure 5:
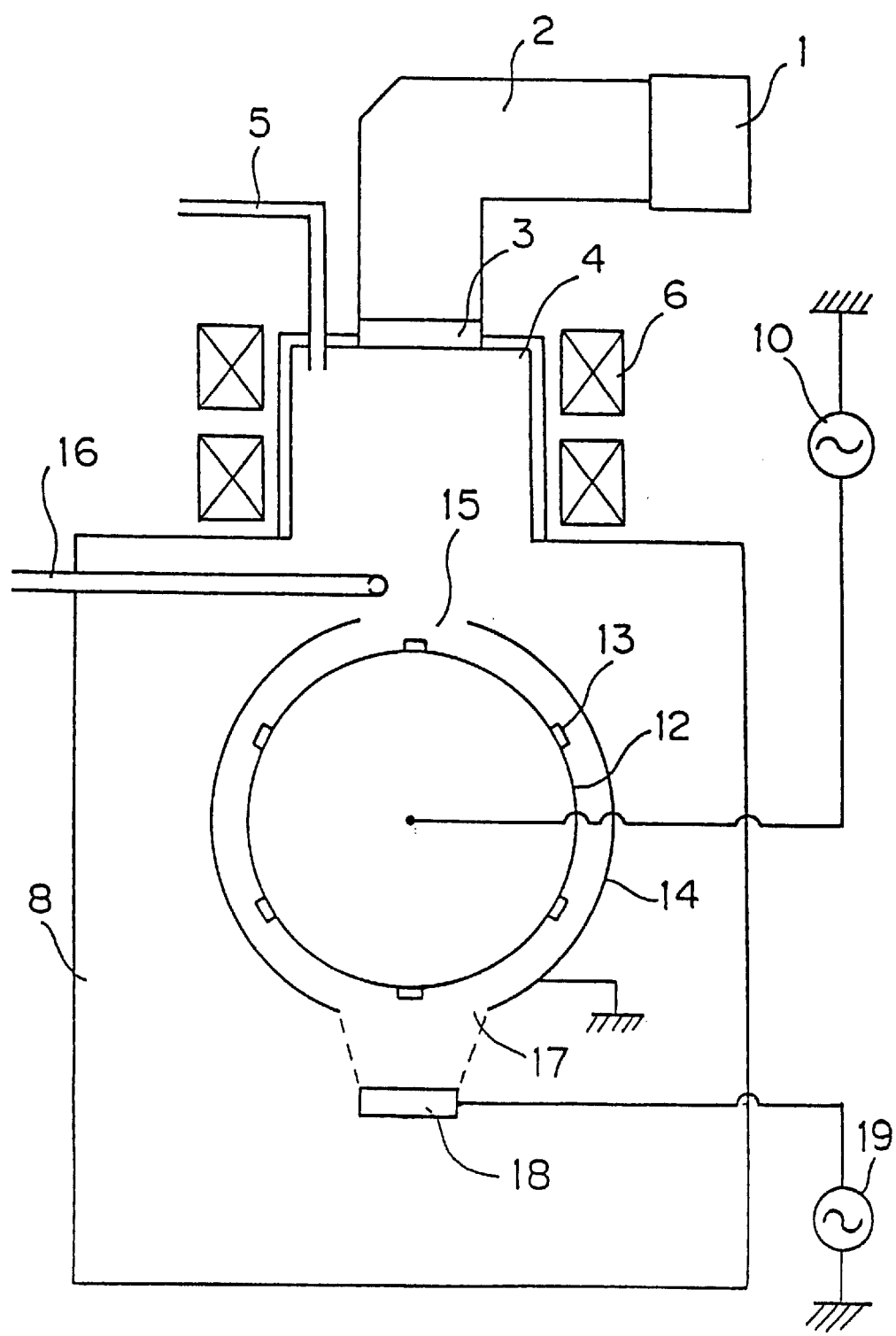
FIG. 5 is a schematic block diagram of an apparatus for forming an interlayer and a hard carbon film as employed in the embodiments in accordance with the first aspect of the present invention.

FIG. 5 is a schematic block diagram of a thin film formation apparatus within which both of the interlayer and the hard carbon film can be formed. Referring to FIG. 5, disposed interior of a vacuum chamber 8 is a plasma generation chamber 4 to which one end of a waveguide 2 is connected. The waveguide 102 has another end to mount a microwave supplying means 1. The microwaves generated within the microwave supplying means 1 pass through the waveguide 2 and a microwave inlet window 3 to be guided into the plasma generation chamber 4. Connected to the plasma generation chamber 4 is a discharge gas inlet line 5 for introducing a discharge gas such as argon (Ar) into the plasma generation chamber 4. A plurality of plasma magnetic field generators 6 are mounted circumferentially of the plasma generation chamber 4. A high-density plasma can be produced within the plasma generation chamber 4 by influencing a high-frequency magnetic field produced by the microwave upon the magnetic field produced by the plasma magnetic field generators 6.

A drum-shaped substrate holder 12 is provided within the vacuum chamber 8 so as to be rotatable about an axis (not shown) which arranged perpendicularly to a wall surface of the vacuum chamber 8. A number of substrates 13 is arranged circumferentially of the substrate holder 12 at regular intervals. A high-frequency power source 10 is connected to the substrate holder 12.

A hollow cylindrical shielding cover 14, made of metal, radially surrounds the substrate holder 12 to define therebetween a predetermined spacing. The shielding cover 14 is connected to a grounded electrode. The shielding cover 14 functions to prevent generation of discharges between the vacuum chamber 8 and the substrate holder 12 excluding target film-forming locations thereon, which discharges will be otherwise generated when a radio frequency (also referred to as RF) voltage is applied to the substrate holder 12 for film-forming. The spacing between the substrate holder 12 and the shielding cover 14 may be dimensioned to be smaller than a mean free path of gaseous molecules. The mean free path of gaseous molecules is equal to or smaller than the average distance that ions or electrons accelerated by an electric field can travel without collisions. Thus, the probability of collisions between the gaseous molecules and the ions or electrons can be lowered to thereby prevent the molecules from undergoing chain electrolytic dissociations by dimensioning the spacing between the substrate holder 12 and the shielding cover 14 not to exceed the mean free path of the gaseous molecules. It is preferred that the spacing between the substrate holder 12 and the shielding cover 14 is dimensioned not to exceed one tenth of the mean free path of the gaseous molecules. In this particular embodiment of the apparatus, the spacing between the substrate holder 12 and the shielding cover 14 is dimensioned to be about 5 mm so as not to exceed one tenth of the mean free path of the gaseous molecules.

The shielding cover 14 has at its top a first opening 15. A plasma from the plasma generation chamber 4 is directed to pass through the first opening 15 to impact the substrates 13 mounted on the substrate holder 12. The vacuum chamber 8 is equipped with a reaction gas inlet line 16. A leading end of the reaction gas inlet line 16 is positioned above the first opening 15.

Figure 6:
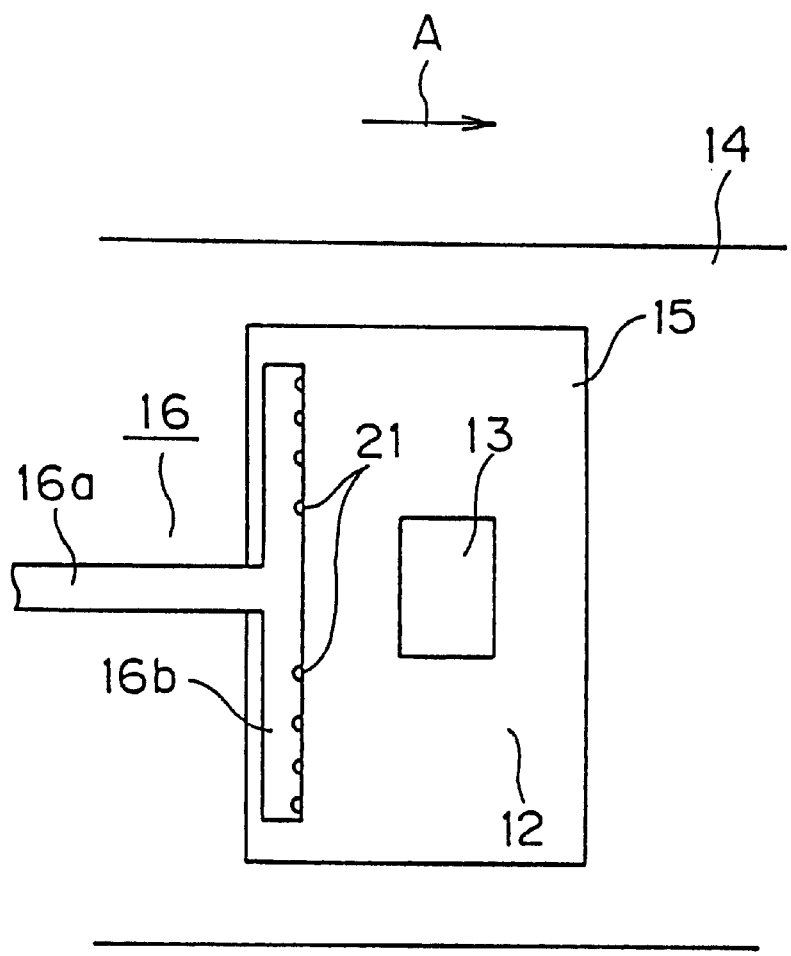
FIG. 6 is a plan view showing a leading end of a reaction gas inlet line of the apparatus shown in FIG. 5 and its vicinities.

FIG. 6 is a plan view showing the leading end of the reaction gas inlet line 16 and its vicinities. Referring to FIG. 6, the reaction gas inlet line 16 includes a gas inlet portion 16a for introducing a $CH_4$ gas into the vacuum chamber 8 and a gas discharge portion 16b for perpendicular connection to the gas inlet portion 16a. The gas discharge portion 16b is arranged to perpendicularly cross a rotational direction A of the substrate holder 12 and is positioned above the first opening 15. In the plan view, the gas discharge portion 16b is located upstream along the direction A within the first opening 15. The gas discharge portion 16b has a plurality of holes 21 which are directed downwardly each at an angle of about 45 degrees. In this particular embodiment, eight holes 21 are provided as shown in FIG. 6. These holes 21 are spaced from each other at distances which become smaller toward each end of the gas discharge portion 16b. The provision of the holes 117 at such spacings allows the $CH_4$ gas introduced from the gas inlet portion 16a to be discharged therefrom with a substantially uniform distribution along the length of the gas discharge portion 16b.

Referring to FIG. 5, the shield cover 14 has at its bottom a second opening 17 facing the first opening 15. A target 18 is disposed below the second opening 17 to upwardly face the second opening 17. Connected to the target 18 is an RF power source 19 for sputtering the target 18. The target 18 and the RF power source constitutes a means for forming the interlayer. Accordingly, in the apparatus of FIG. 5, the hard carbon film is formed by the plasma CVD method at a location of the first opening 15 while the interlayer is formed by sputtering at a location of the second opening 17.

The employment of such an apparatus as shown in FIG. 5 enables the simultaneous formation of thin films on a number of substrates.

EXAMPLE 1

Interlayer: B

The apparatus of FIG. 5 was employed to form the interlayer and the diamond-like carbon film. A partial pressure of the Ar gas within the vacuum chamber 8 was set at $1.5 \times 10^{-3}$ Torr. B was used as the target 18 and a power supplied to the target 18 was set at 200 W. The interlayer comprised of B was formed on the Ni substrate 13 by applying a RF voltage to the substrate holder 12 such that a self-bias voltage produced in the substrate 13 reached −50 V. This step was continued for 30 minutes. As a result, the interlayer was formed to a thickness of about 0.05 $\mu$m. Here, twenty four of the Ni substrates 13 were mounted circumferentially of the substrate holder 12 at regular intervals. In forming the interlayers on the respective substrates 13, the substrate holder 12 was rotated at a speed of about 10 rpm.

A hard carbon film, i.e. a diamond-like carbon film was then formed on the interlayer overlying the Ni substrate 13. An interior of the vacuum chamber 8 was controlled at a pressure of $10^{-5}$–$10^{-7}$ Torr. The Ar gas at $5.7 \times 10^{-4}$ torr. was then supplied from the discharge gas inlet line 5 of the ECR plasma generator while a 2.45 GHz, 100 W microwave was supplied from the microwave supplying means 1, so that an Ar plasma generated within the plasma generation chamber 4 struck a surface of each substrate 13. Simultaneously, a 13.56 MHz RF voltage from the high-frequency power source 10 was applied to the substrate holder 12 in a controlled fashion so that a self-bias voltage of −50 V was generated in each of the substrates 13. A $CH_4$ gas at $1.3 \times 10^{-3}$ Torr. was supplied through the reaction gas inlet line 16. This step was continued for about 15 minutes to form the diamond-like carbon film having a thickness of 1000 Å on the surface of each substrate 13.

EXAMPLE 2

Interlayer: Nitride of B

The apparatus of FIG. 5 was employed as similar to Example 1. The partial pressures of Ar and $N_2$ gases were set at $1.5 \times 10^{-3}$ Torr. and $5.0 \times 10^{-4}$ Torr., respectively. B was used as the target and a power supplied to the target was set at 200 W. The interlayer comprised of nitride of B was thus formed on the Ni substrate 13. Here, a RF voltage was applied to the substrate holder 12 so that a self-bias voltage produced in the substrate 13 reached −50 V. This interlayer formation was continued for 40 minutes. As a result, the interlayer comprised of BN was formed to a thickness of about 0.05 $\mu$m.

Subsequently, the diamond-like carbon film was formed on the interlayer to a thickness of 1000 Å in the same manner as in Example 1.

EXAMPLE 3

Interlayer: Oxide of Al

The apparatus of FIG. 5 was employed as similar to Example 1. The partial pressures of Ar and $O_2$ gases were set at $1.5 \times 10^{-3}$ Torr. and $1.0 \times 10^{-3}$ Torr., respectively. Al was used as the target and a power supplied to the target was set at 400 W. The interlayer comprised of oxide of Al was thus formed on the Ni substrate 13. Here, a RF voltage was applied to the substrate holder 12 so that a self-bias voltage of −50 V was produced in the substrate 13. This interlayer formation was continued for 30 minutes. As a result, the interlayer was formed to a thickness of about 0.04 $\mu$m.

Subsequently, the diamond-like carbon film was formed on the interlayer to a thickness of 1000 Å in the same manner as in Example 1.

EXAMPLE 4

Interlayer: Nitride of Cr

The apparatus of FIG. 5 was employed as similar to Example 1. The partial pressures of Ar and $N_2$ gases were set at $1.5 \times 10^{-3}$ Torr. and $1.0 \times 10^{-3}$ Torr., respectively. Cr was used as the target and a power supplied to the target was set at 400 W to form the interlayer, comprised of nitride of Cr, on the Ni substrate 13. Here, a RF voltage was applied to the substrate holder 12 so that a self-bias voltage of −50 V was produced in the substrate 13. This interlayer formation was continued for 30 minutes. As a result, the interlayer was formed to a thickness of about 0.05 $\mu$m.

Subsequently, the diamond-like carbon film was formed on the interlayer to a thickness of 1000 Å in the same manner as in Example 1.

EXAMPLE 5

Interlayer: Oxide of Sn

The apparatus of FIG. 5 was employed as similar to Example 1. The partial pressures of Ar and $O_2$ gases were set at $1.5 \times 10^{-3}$ Torr. and $1.0 \times 10^{-3}$ Torr., respectively. Sn was used as the target and a power supplied to the target was set at 400 W to form the interlayer, comprised of oxide of Sn, on the Ni substrate 13. Here, a RF voltage was applied to the substrate holder 12 so that a self-bias voltage of −50 V was produced in the substrate 13. This interlayer formation was continued for 30 minutes. As a result, the interlayer was formed to a thickness of about 0.04 μm.

Subsequently, the diamond-like carbon film was formed on the interlayer to a thickness of 1000 Å in the same manner as in Example 1.

EXAMPLE 6

Interlayer: Co

The apparatus of FIG. 5 was employed as similar to Example 1. The partial pressure of Ar was set at $1.5 \times 10^{-3}$ Torr. Co was used as the target and a power supplied to the target was set at 400 W to form the interlayer, comprised of Co, on the Ni substrate 13. Here, a RF voltage was applied to the substrate holder 12 so that a self-bias voltage of −50 V was produced in the substrate 13. This interlayer formation was continued for 30 minutes. As a result, the interlayer was formed to a thickness of about 0.05 μm.

Subsequently, the diamond-like carbon film was formed on the interlayer to a thickness of 1000 Å in the same manner as in Example 1.

COMPARATIVE EXAMPLE 1

For comparative purposes, a diamond-like carbon film was directly formed on a Ni substrate without intervention of an interlayer therebetween. The diamond-like carbon film formation was performed in the same conditions as used in Example 1.

The diamond-like carbon film-coated Ni substrates as obtained in Examples 1–6 and Comparative Example 1 were evaluated for their levels of adhesion. The adhesion evaluation was made by an indentation test in which a Vickers indenter was forced under a constant load (Load=1 kg) into surfaces of the substrates. Fifty samples were taken for each diamond-like carbon film-coated Ni substrate, and the number of samples which showed delamination of the diamond-like carbon film from the Ni substrate was counted as being indicative of a level of adhesion of the hard carbon film. Results are given in Table 1.

TABLE 1

|  | Example No. |  |  |  |  |  | Comp. Example No. |
|---|---|---|---|---|---|---|---|
|  | 1 | 2 | 3 | 4 | 5 | 6 | 1 |
| Number of *Samples | 0 | 0 | 0 | 0 | 0 | 0 | 43 |

*Samples which showed delamination of the diamond-like carbon film

As apparent from the results given in Table 1, each of the diamond-like carbon film-coated Ni substrates of Examples 1–6, which incorporated the interlayer in accordance with the first aspect of the invention, shows the number of its samples that experienced delamination as being much smaller relative the diamond-like carbon film-coated Ni substrate of Comparative Example 1. This demonstrates that the provision of the interlayer in accordance with the first aspect of the present invention enhances the adhesion of the diamond-like carbon film to the Ni substrate.

Figure 7:
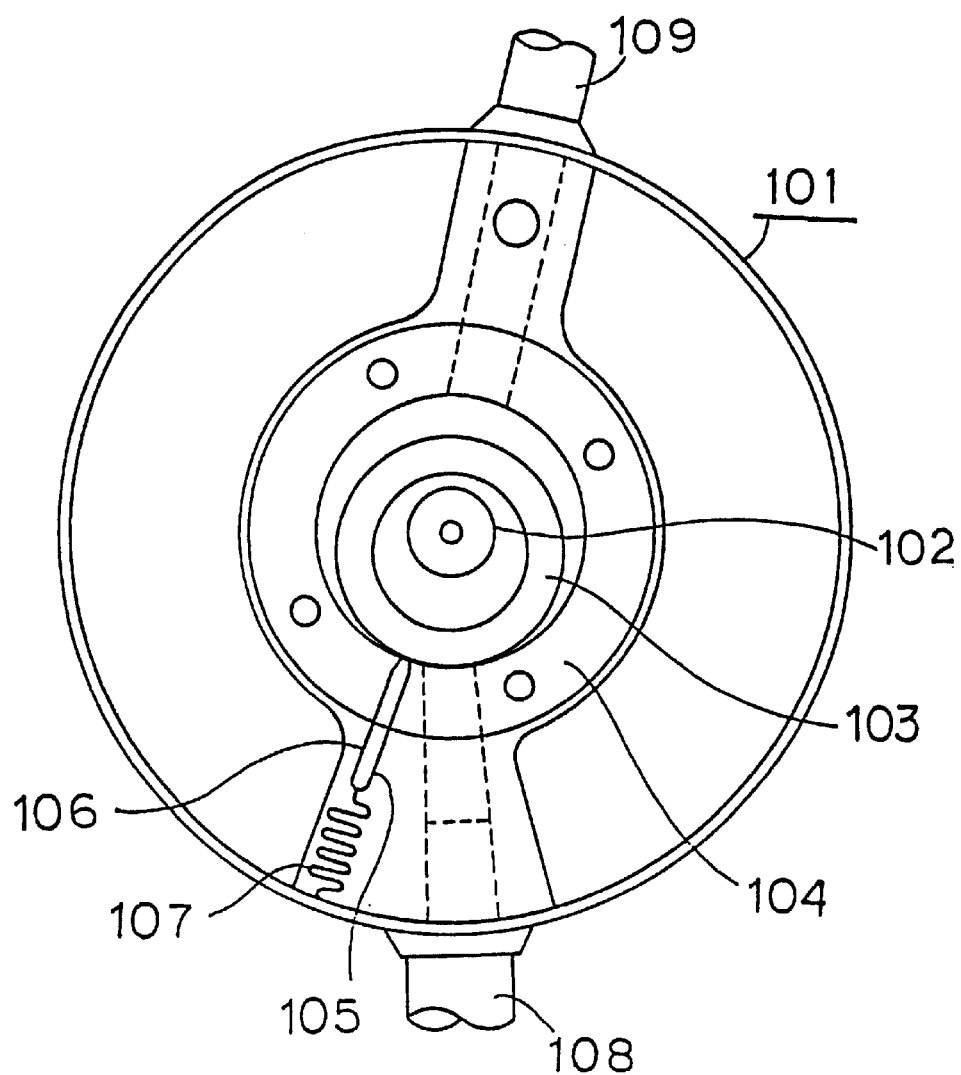
FIG. 7 is a schematic cross-sectional view showing a general construction of a rotary compressor.

FIG. 7 is a schematic cross-sectional view showing a general construction of a rotary compressor.

Referring to FIG. 7, the rotary compressor includes a closed container 101, a crank shaft 102 driven by an electric motor (not shown), and a roller 103 mounted eccentric to the crank shaft 102. The roller 103 is made of Mo—Ni—Cr cast iron.

A hollow cylinder 104 of cast iron is disposed to accommodate the roller 103 therein.

The hollow cylinder 104 has a cylinder channel 105 within which a vane 106 reciprocates. The vane 106 partitions a space interior of the hollow cylinder 104 into a high-pressure part and a low-pressure part. The vane 106 is made of high-speed tool steel (SKH51).

The vane 106 is urged against the roller 103 by a spring 107.

An inlet tube 108 is provided to supply a refrigerant carrier into the interior of the hollow cylinder 104. The refrigerant carrier pressurized and heated within the hollow cylinder 104 is exhausted through an exhaust tube 109 to the exterior of the compressor.

The operation of the rotary compressor as constructed in the manner as described above will be now explained.

When the electric motor drives the crank shaft 102, the roller 103 mounted eccentric to the crank shaft 102 moves circumferentially along an inner surface of the hollow cylinder 104 while rotating. Since the vane 106 is urged against the roller 103 by both a pressurized gas and the spring 107, the vane 106 is brought into a constant contact with a periphery of the roller 3. Accordingly, a rotational motion of the roller 103 is translated into a reciprocating motion of the vane 106 within the cylinder channel 105.

As such a reciprocating motion is continued, the refrigerant carrier is suctioned through the inlet tube 108 into the interior of the hollow cylinder 104 within which the refrigerant carrier is compressed to increase its temperature and pressure before it is discharged through the exhaust tube 109 to the exterior of the rotary compressor.

Figure 8:
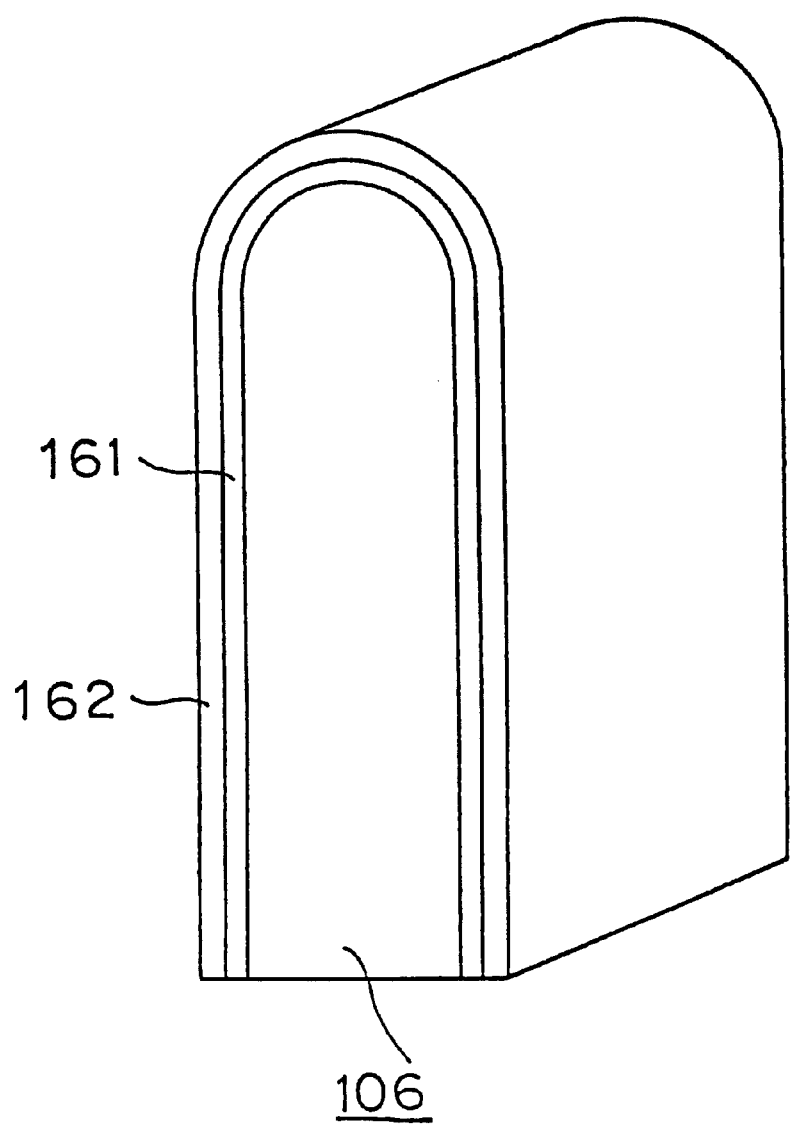
FIG. 8 is a schematic cross-sectional view of a hard carbon film-coated vane in accordance with the first aspect of the present invention.

FIG. 8 is a schematic cross-sectional view of the vane 106 carrying a hard carbon coating film thereon, in accordance with the first aspect of the present invention. Formed on the vane 106 is an interlayer 161 on which a hard carbon film 162 is formed.

Figure 9:
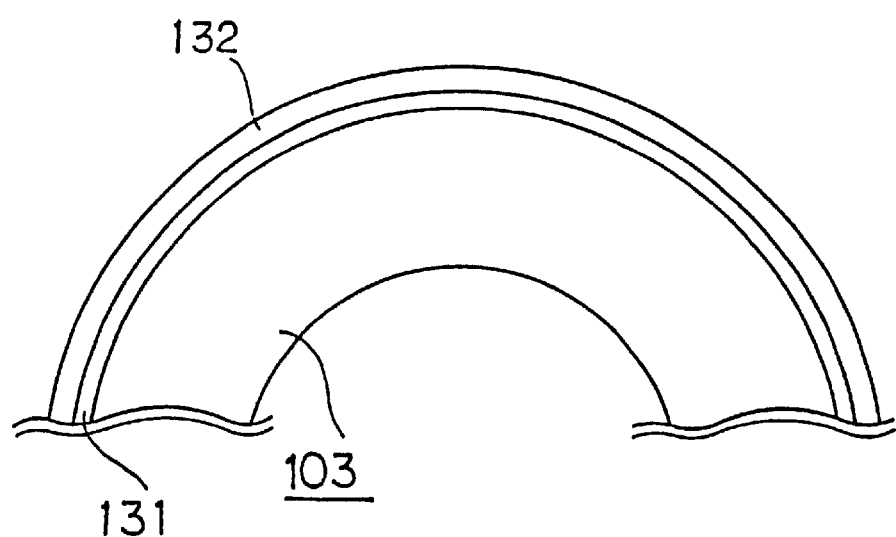
FIG. 9 is a schematic cross-sectional view of a hard carbon film-coated roller in accordance with the first aspect of the present invention.

FIG. 9 is a schematic cross-sectional view of the roller 103 carrying thereon a hard carbon film, in accordance with the first aspect of the present invention. Formed on the roller 103 is an interlayer 131 on which a hard carbon film 132 is formed.

Figure 10:
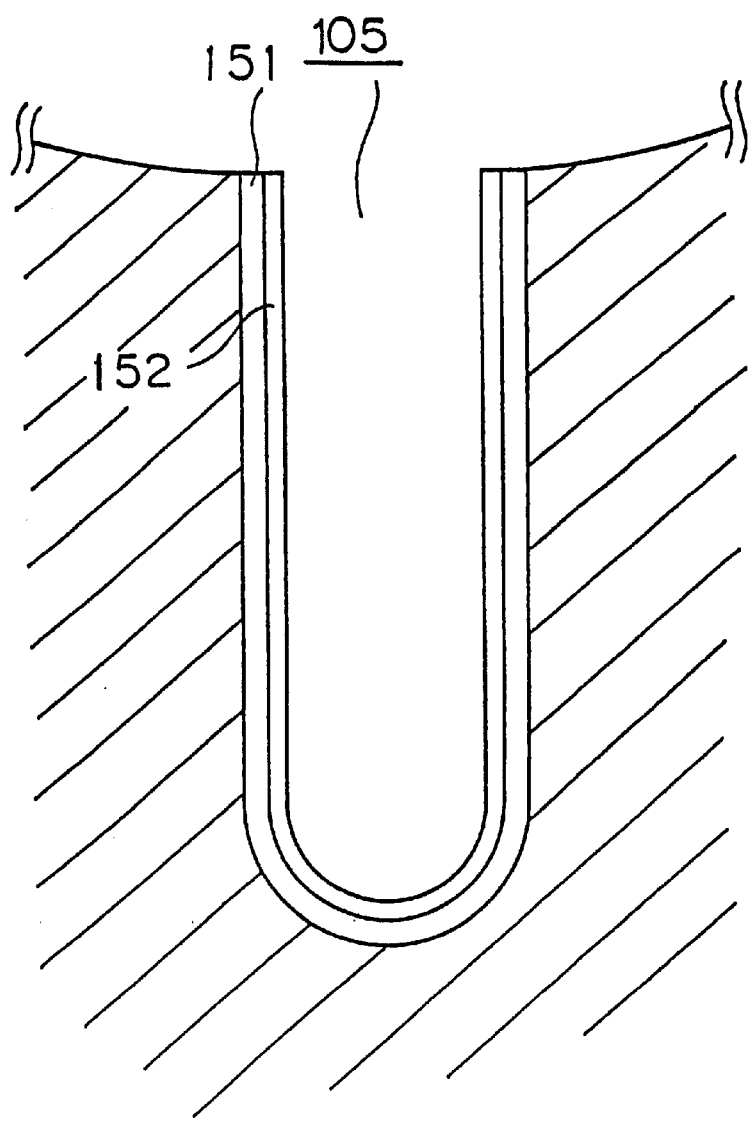
FIG. 10 is a schematic cross-sectional view of a hard carbon film-coated cylinder channel in accordance with the first aspect of the present invention.

FIG. 10 is a schematic cross-sectional view of the cylinder channel 105 carrying thereon a hard carbon film, in accordance with the first aspect of the present invention. Formed on an inner surface of the cylinder channel 105 is an interlayer 151 on which a hard carbon film 152 is formed.

The hard carbon film provided on the vane 106 of FIG. 8 was then tested for evaluating its adhesion level. The apparatus of FIG. 5 was employed. The partial pressure of Ar gas was set at $1.5 \times 10^{-3}$ Torr. Cr was used as a target and a power supplied to the target was set at 400 W to form a Cr interlayer on the vane 106. Here, a RF voltage was applied to the substrate holder so that a self-bias voltage of −50 V was produced in the substrate. This interlayer formation was continued for 30 minutes. As a result, the interlayer was formed to a thickness of about 0.05 μm.

Subsequently, the hard carbon film formation was continued for 75 minutes in the same manner as in Example 1 so that the hard carbon film 162 was formed on the interlayer 161 to a thickness of about 5000 Å.

The hard carbon film-coated substrate thus obtained was tested for evaluating its level of adhesion. The adhesion evaluation was made by an indentation test in which a diamond-sphere indenter having a tip radius of 0.1 mm was forced under a constant load (Load=500 g) into a surface of the substrate. Fifty samples were taken for the hard carbon film-coated vane 106, and the number of samples which showed delamination of the hard carbon film 162 from the vane 106 was counted as being indicative of a level of adhesion of the hard carbon film. For comparative purposes, a hard carbon film was directly formed on the vane 106, without intervention of the Cr interlayer, by applying a RF voltage to the substrate holder such that a self-bias voltage of −50 V was produced in the vane 106. The obtained hard carbon film was also tested for evaluating its adhesion to the vane. Results are given in Table 2.

TABLE 2

| Cr Interlayer | Self-Bias Voltage (V) | Number of *Samples |
|---|---|---|
| Absent | −50 | 45 |
| Present | −50 | 5 |

*Samples which showed delamination of the hard carbon film

As can be clearly seen from Table 2, in the case where the Cr interlayer 161 was absent on the vane 106, forty five samples showed delamination of the hard carbon film 162 even if the self-bias voltage of −50 V was produced in the vane. In contrast, in the case where the Cr interlayer 161 was present on the vane 106 and the hard carbon film 162 was formed on the interlayer 161 at the self-bias voltage of −50 V, only five samples showed delamination of the hard carbon film 162.

In the above Examples, the interlayer was specified to be formed by sputtering. However, the method of forming the interlayer in accordance with the first aspect of the present invention is not limited to sputtering. The interlayer can be formed by the other methods including the other physical thin film formation methods such as deposition methods, chemical vapor phase epitaxial methods such as CVD methods, and plating methods. Although the apparatus of FIG. 5 was employed in the above Examples to form both the interlayer and the hard carbon film, the other apparatuses may be employed to separately form the interlayer and the hard carbon film.

The provision of the interlayer between the substrate and the hard carbon film, in accordance with the first aspect of the present invention, enhances adhesion and peel resistance of the hard carbon film.

The preferred embodiments in accordance with the second aspect of the present invention will be now described.

Figure 11:
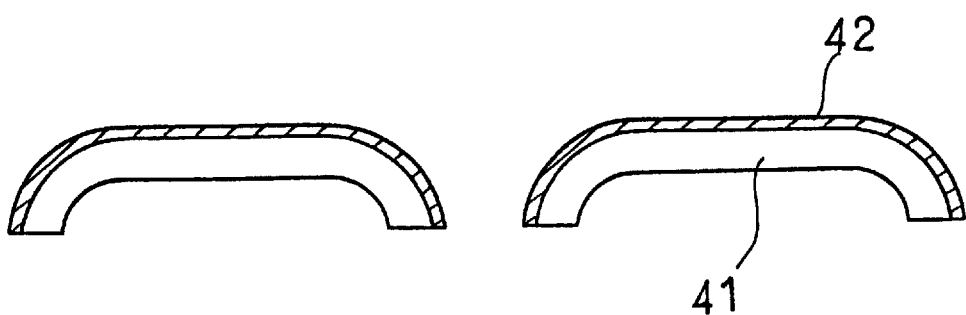
FIG. 11 is a cross-sectional view of the electric shaver outer blade having an outer surface on which the interlayer is formed.

FIG. 11 is a cross-sectional view of an outer blade substrate 41 on which an interlayer 42 is formed by plating. The outer blade substrate may be electroformed, for example.

Figure 12:
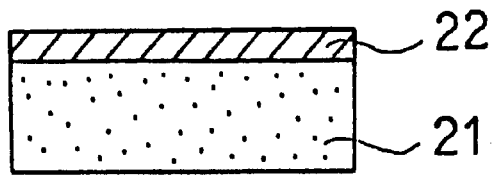
FIG. 12 are cross-sectional views showing a series of steps of electroforming a substrate in accordance with a second aspect of the present invention and thereafter forming an interlayer on the substrate.
Figure 12:
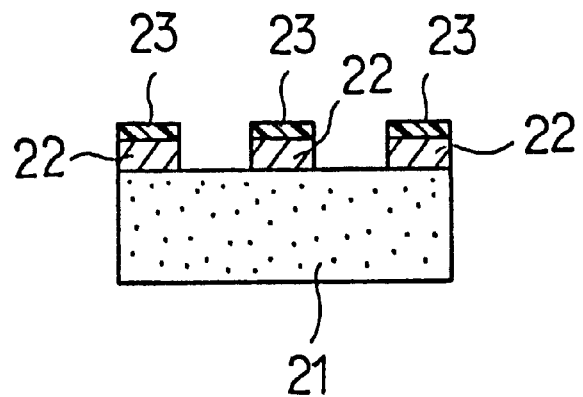
Figure 12:
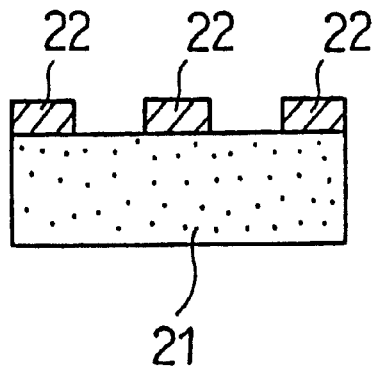

FIG. 12 are cross-sectional views showing the steps of forming the interlayer by plating, subsequent to electroforming the outer blade substrate. As shown in FIG. 12(a), a metallic layer 22 is provided on a plastic plate 21 by plating nickel or applying a copper foil on the plastic plate 21. The metallic layer 23 is coated with a resist 23 in such a pattern as corresponding to an outer blade of an electric shaver. The resist 23 protects the coated area of the metallic layer 23 from the action of an etchant so that the metallic layer 23 is etched to the predetermined pattern of the outer blade for an electric shaver, as shown in FIG. 12(b). The subsequent removal of the resist 23 leaves the metallic layer 22 having the pattern of the electric shaver outer blade on the plastic plate 21, as shown in FIG. 12(c).

As shown in FIG. 13(d), a nickel plating is applied to the metallic layer 22 to obtain the outer blade substrate 41 for the electric shaver by electroforming. A commonly-employed electroplating bath may be utilized for the electroforming. An exemplary electroplating bath contains 30 g/l of nickel chloride, 300 g/l of nickel sulfamate, 30 g/l of boric acid, and a suitable amount of a pit inhibitor. The electroplating may be carried out in the pH range of 3.5–4.0, at temperatures of 30–60° C. and current densities of 2–15 A/dm$^2$, for example, to deposit a nickel layer. The thickness of the nickel layer to be deposited is not particularly specified, but is generally in the range of 10–100 µm.

The interlayer 42 is subsequently formed on the outer blade substrate 41 such as by electroplating or electroless plating while the outer blade substrate 41 is held on the metallic layer 22, as shown in FIG. 13(e). The suitable plating bath and conditions may be selected depending upon the type of the interlayer 42 to be deposited by plating. The thickness of the interlayer 42 generally ranges from about 50 to 5000 Å.

When the outer blade substrate 41 is removed from the metallic layer 22, the outer blade substrate 41 for an electric shaver is obtained which carries the interlayer 42 thereon, as shown in FIG. 13(f). A diamond-like or hard carbon film is then formed on the interlayer to obtain an electric shaver outer blade having the interlayer through which the hard carbon film is provided on the outer blade substrate. Here, the hard carbon film may be formed on the interlayer 42 after the outer blade substrate 41 carrying the interlayer 42 has been removed from the metallic layer 22. Alternatively, the hard carbon film may be formed on the interlayer 42 while the outer blade substrate 41 carrying the interlayer 42 is held on the metallic layer 22. This follows that the outer blade substrate 41 is removed from the metallic layer 22 subsequent to the hard carbon film formation.

EXAMPLE 7

Figure 13:
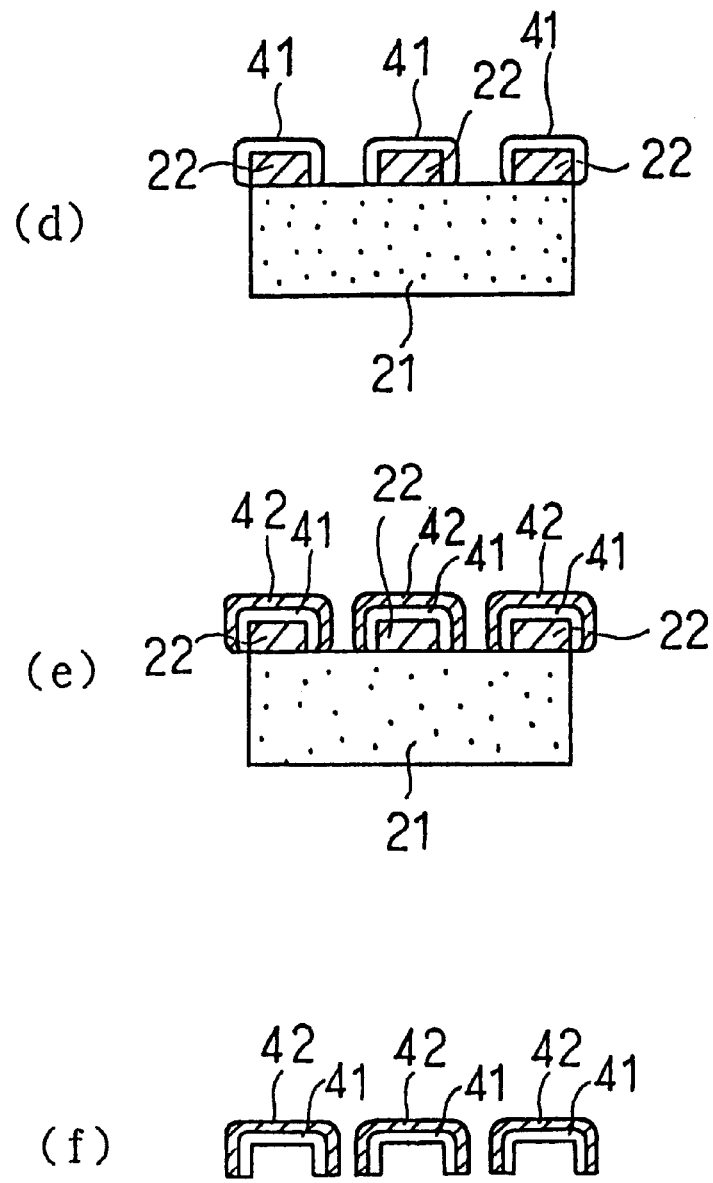
FIG. 13 are cross-sectional views showing another series of steps of electroforming a substrate in accordance with the second aspect of the present invention and thereafter forming an interlayer on the substrate.

The steps shown in FIGS. 12 and 13 were taken to electroform a Ni substrate for an electric shaver outer blade on which an interlayer of Ru was formed.

A Ni plating bath used in electroforming the Ni substrate contained 30 g/l of nickel chloride, 300 g/l of nickel sulfamate, 30 g/l of boric acid, and a suitable amount of a pit inhibitor. The Ni plating bath was adjusted to a pH of 3.5 and controlled at a temperature of 50° C. The electroforming was then initiated at a current density of 10 A/dm$^2$ to deposit the Ni substrate on a mold. The thickness of the Ni substrate was about 50 µm.

The Ru plating was carried out while the Ni substrate was held on the mold to form the Ru interlayer on the Ni substrate. An Ru plating bath as employed contained 3 g/l of ruthenium sulfate, 6 g/l of sulfuric acid and a suitable amount of additives. The Ru plating bath was adjusted to a pH of about 1.5 and controlled at a temperature of about 50° C. The Ru electroplating was then performed at a current density of 2 A/dm$^2$ to deposit the Ru interlayer on the Ni substrate. The thickness of the Ru interlayer was about 100 Å.

Subsequent to forming the Ru interlayer on the Ni substrate as described above, a diamond-like carbon film was formed on the Ru interlayer using the ECR plasma CVD apparatus. The partial pressures of the Ar and $CH_4$ gases were set at $5.7 \times 10^{-4}$ Torr. and $1.3 \times 10^{-3}$ Torr., respectively. A microwave power of 100 W at a microwave frequency of 2.45 GHz was supplied during the thin film formation. The 13.56 MHz RF power from the high-frequency power source was supplied to the substrate holder in a controlled fashion so that a self-bias voltage of −50 V was produced in each of the substrates. The thin film formation was continued for 15 minutes. As a result, the diamond-like carbon film was formed to a thickness of 1000 Å. Thereafter, the Ni substrate was removed from the mold.

EXAMPLE 8

Subsequent to forming the Ni substrate on the mold in the same manner as in Example 7, a Sn plating was performed to form a Sn interlayer on the Ni substrate. The employed Sn plating bath contained 90 g/l of sodium stannate, 8 g/l of sodium hydroxide and 10 g/l of sodium acetate. The Sn plating bath was controlled at a temperature of 70° C. The Sn electroplating was then performed at a current density of 1.5 A/dm² to deposit the Sn interlayer on the Ni substrate. The thickness of the Sn interlayer was about 100 Å.

Subsequent to forming the Sn interlayer, a diamond-like carbon film was formed on the Sn interlayer in the same manner as in Example 7 to a thickness of about 1000 Å.

EXAMPLE 9

The Ni substrate was formed on the mold in the same manner as employed in Example 7. Thereafter, a composite plating bath which dispersed SiC particles in the Sn plating bath was used to form the interlayer. The Sn plating bath was identical to that of Example 8. The SiC particles having an average particle size of about 0.1 μm were dispersed in the Sn plating bath to prepare the composite plating bath containing 10 weight % of the SiC particles. The plating conditions identical to those of Example 8 were used to form the interlayer having a thickness of about 0.5 μm and comprised of a Sn film in which the SiC particles were dispersed. This Sn film contained 5 volume % of the SiC particles.

Subsequently, a diamond-like carbon film was formed on the interlayer as similarly to Example 7.

COMPARATIVE EXAMPLE 2

Subsequent to forming the Ni substrate on the mold in the same manner as in Example 7, a diamond-like carbon film was directly formed on the Ni substrate without intervention of any interlayer therebetween. The diamond-like carbon film formation was performed in the same manner as in Example 7.

The diamond-like carbon films as respectively obtained in Examples 7–9 and Comparative Example 2 were evaluated for their levels of adhesion. The adhesion evaluation was made by an indentation test in which a Vickers indenter was forced under a constant load (Load=1 kg) into surfaces of the diamond-like carbon films. Fifty samples were taken for each of the diamond-like carbon films, and the number of samples which showed delamination of the diamond-like carbon film from the Ni substrate was counted as being indicative of a level of adhesion of the diamond-like carbon film. Results are given in Table 3.

TABLE 3

| | Example No. | | | Comp. Example No. |
|---|---|---|---|---|
| | 7 | 8 | 9 | 2 |
| Number of *Samples | 0 | 0 | 0 | 43 |

*Samples which showed delamination of the diamond-like carbon film

As can be clearly seen from Table 3, the diamond-like carbon films of Examples 7–9 each provided on the Ni substrate through the interlayer exhibit superior peel resistances relative to the diamond-like carbon film of Comparative Example 2 to thereby demonstrate a higher level of adhesion to the Ni substrate.

EXAMPLE 10

Figure 14:
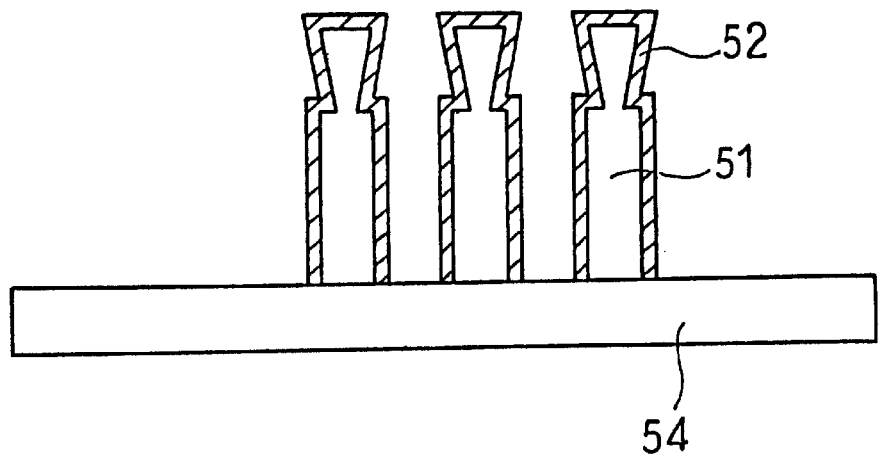
FIG. 14 is a partly-sectioned side view showing an exemplary arrangement of inner blades of an electric shaver on which respective interlayers are formed by plating in accordance with the second aspect of the present invention.
Figure 15:
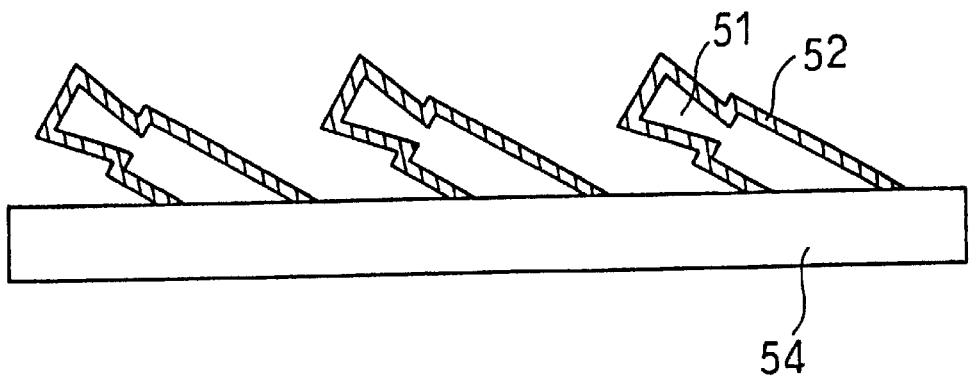
FIG. 15 is a partly-sectioned side view showing a comparative arrangement of inner blades of an electric shaver on which respective interlayers are formed by sputtering.

The Ru electroplating was performed to form an Ru interlayer on a substrate for an electric shaver inner blade as shown in FIG. 2. During the Ru electroplating, the inner blade substrates 51 were held upright on a jig 54 for coating treatment as shown in FIG. 14. The Ru plating bath and plating conditions as used here were identical to those of Example 7.

The uniform coverage of the Ru interlayer even on edge portions of the substrate 51 were recognized.

COMPARATIVE EXAMPLE 3

A sputtering method was used to form an Ru interlayer 52 on the inner blade substrates 51 which were held upright relative to the jig 54 as shown in FIG. 14. The partial pressure of Ar gas was set at $1.5 \times 10^{-3}$ Torr. Cr was used as a target and a power supplied to the target was set at 400 W to form the Ru interlayers having a thickness of about 100 Å. The resulting Ru interlayers were observed as providing poor coverages on respective substrates, particularly at edge portions of the substrates.

COMPARATIVE EXAMPLE 4

The inner blade substrates 51 were mounted in an inclined manner to the jig 54 for coating treatment. While such an arrangement was kept, the Ru interlayer 52 was formed on each substrate 51 by the sputtering method as analogously to Comparative Example 3. The inner blade substrates 51 were then rearranged to incline in the opposite direction prior to supplemental interlayer formation thereon. As a result, the interlayer coating was improved at edge porions of the substrate to provide the substantially uniform interlayer around the substrate.

As can be appreciated by comparing Example 10 with Comparative Examples 3 and 4, the interlayer formation by plating, in accordance with the second aspect of the present invention, is effective in providing a uniform thin film coating even on a substrate having complicated three-dimensional configurations. Thus, the formation of a hard carbon film on such an interlayer can improve adhesion of the hard carbon film to the substrate.

In the above Examples, the interlayer was formed on the inner and outer blade substrates for an electric shaver for subsequent hard carbon film formation thereon. However, those inner and outer blade substrates serve as exemplary purposes only, and should not be considered as limiting. It should be understood that the present invention is applicable to other types of substrates. Although the interlayer is also described in the above Examples to be formed by electroplating, the interlayer may be formed by electroless plating in the present invention.

It should be also understood that the second aspect of the present invention can be applied only one of the inner and outer electric shaver blades. Although the interlayer and the hard carbon film are described in the above Examples to be formed only on the outer surface of the electric shaver outer blade, they may be additionally formed on the inner surface of the electric shaver outer blade.

In accordance with the second aspect of the present invention, the interlayer is formed on the substrate by plating. This enables a uniform formation of the interlayer even on the substrate having complicated three-dimensional configurations, such as electric shaver outer and inner blades, and provides an improved adhesion of the hard carbon film formed on the interlayer to the substrate.

Also, in accordance with the second aspect of the present invention, the electroforming method is utilized to deposit the substrate on the mold, and thereafter the interlayer is formed on the substrate by plating. Accordingly, it is possible to form the interlayer while the substrate is held on the mold, consecutive to the substrate formation. This simplifies the fabricating steps to increase the production efficiency of the hard carbon film-coated substrate.

What is claimed is:

1. A method for preparing a hard carbon film on a substrate comprising the steps of:

forming an interlayer on said substrate by plating; and forming said hard carbon film on said interlayer;

wherein fine particles of oxides, nitrides or carbides are dispersed in said interlayer.

2. A method for providing a hard carbon film on a substrate comprising the steps of:

deposition-forming said substrate on a mold through electroforming;

forming an interlayer on said substrate by plating; and forming said hard carbon film on said interlayer;

wherein fine particles of oxides, nitrides or carbides are dispersed in said interlayer.

3. The method of claim 1, wherein, in the plating step, said interlayer is formed while the substrate is held on the mold.

4. The method of claim 1, wherein at least a surface of said substrate is electrically conductive.

5. The method of claim 1, wherein said substrate comprises a metal or an alloy formed principally of Ni or Al, or stainless steel.

6. The method of claim 1, wherein said substrate is a substrate of an electric shaver blade.

7. The method of claim 1, wherein said substrate comprises cast iron, steel, stainless steel, ferrous alloys, non-ferrous metallic materials, ceramics, noble metals or carbon.

8. The method of claim 1, wherein said substrate is a substrate of a sliding part.

9. The method of claim 1, wherein said interlayer comprises at least one metal selected from the group consisting of Ru, Cr, Sn and Co, or an alloy principally comprised thereof.

* * * * *